US007723979B2

(12) United States Patent
Ashburn, Jr. et al.

(10) Patent No.: US 7,723,979 B2
(45) Date of Patent: May 25, 2010

(54) INTEGRATED ENERGY METERING SYSTEM

(75) Inventors: Michael Anthony Ashburn, Jr., Groton, MA (US); Stephen William Harston, Andover, MA (US); Etienne Gerard Moulin, Northborough, MA (US); Shuang Jin, Andover, MA (US); Meghan C. Kaiserman, Middleton, MA (US); Alberto Sanchez, Valencia (ES); David Paul Smith, Pembroke, MA (US)

(73) Assignee: Analog Devices, Inc., Norwood, MA (US)

( * ) Notice: Subject to any disclaimer, the term of this patent is extended or adjusted under 35 U.S.C. 154(b) by 84 days.

(21) Appl. No.: 11/906,394

(22) Filed: Oct. 2, 2007

(65) Prior Publication Data
US 2008/0218154 A1    Sep. 11, 2008

Related U.S. Application Data

(60) Provisional application No. 60/848,914, filed on Oct. 3, 2006.

(51) Int. Cl.
G01R 7/00 (2006.01)
(52) U.S. Cl. .................................... 324/142; 324/158.1
(58) Field of Classification Search ............... 324/99 D, 324/142; 702/61
See application file for complete search history.

(56) References Cited

U.S. PATENT DOCUMENTS 5,122,735 A * 6/1992 Porter et al. ................ 324/142
5,194,850 A * 3/1993 Bourrieres et al. .......... 340/660
5,426,430 A    6/1995 Schlig
5,544,089 A    8/1996 Hemminger et al.
5,942,051 A * 8/1999 Takashima et al. .......... 148/111
6,628,207 B1 * 9/2003 Hemminger et al. ..... 340/870.02
6,638,789 B1 * 10/2003 Glenn et al. ................. 438/109
6,665,620 B1   12/2003 Burns et al.
6,847,300 B2   1/2005 Yee et al.
7,142,846 B1 * 11/2006 Henderson ................... 455/417
7,208,955 B2 * 4/2007 Zansky et al. ............... 324/418
7,504,821 B2 * 3/2009 Shuey ......................... 324/142
2006/0087289 A1 * 4/2006 Chen .......................... 320/128
2006/0195638 A1 * 8/2006 Yamazaki .................... 710/106

* cited by examiner

Primary Examiner—Ha Tran T Nguyen
Assistant Examiner—Richard Isla Rodas
(74) Attorney, Agent, or Firm—Kenyon & Kenyon LLP

(57) ABSTRACT

An integrated energy metering system having an energy meter including a voltage ADC for sensing voltage, a current ADC for sensing current, a microcontroller; a first memory device for storing program data for the energy meter; and a plurality of circuit blocks; a voltage monitor for monitoring a primary power supply; a power supply switch circuit for selectively applying one of the primary and auxiliary power supplies to the energy meter; and a system controller responsive to the voltage monitor for operating the switch circuit to apply the auxiliary power supply when the primary power supply voltage decreases below a predetermined level and gating the power to a first class of circuit blocks in the energy meter and applying power continuously to a second class of circuit blocks.

30 Claims, 6 Drawing Sheets

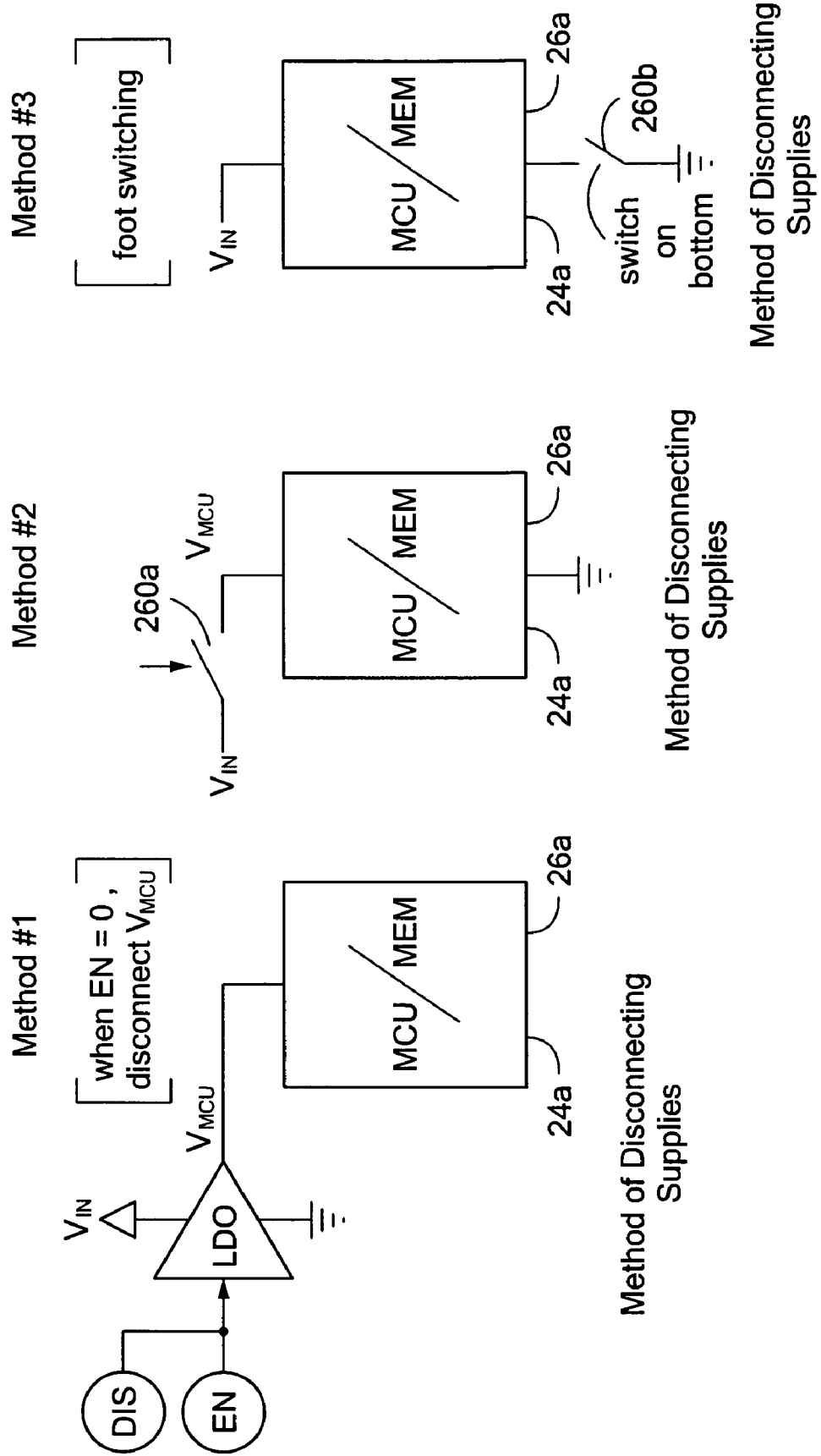

INTEGRATED ENERGY METERING SYSTEM

RELATED APPLICATIONS

This application claims benefit of and priority to U.S. Provisional Application Ser. No. 60/848,914 filed Oct. 3, 2006, entitled LOW POWER SYSTEM ON A CHIP incorporated herein by this reference.

FIELD OF THE INVENTION

This invention relates to a system controller and more particularly to a systems controller for conserving operating power for an integrated energy metering system during low/no primary power conditions where an auxiliary power source is required.

BACKGROUND OF THE INVENTION

For the majority of last 100 years, energy metering has been almost exclusively performed using electromechanical meters. These meters are easily identified by a large spinning disk in their center rotating at a rate proportional to the rate of energy usage (power). The basic function of these traditional meters is that an electromechanical transducer generates a rotational force in response to the magnitude of voltage and current passing through the sensors. This force then rotates a mechanical counter that is used to store and display the net energy used by the household or business for which the meter is used. Drawbacks to the electromechanical meter include limited accuracy (1%-2%) and limited functionality.

Solid-state energy meters employ integrated circuit (IC) technology in order to accurately measure voltage and current which are then used to determine energy usage. While the solid-state meters have provided higher accuracy than the electromechanical meters since they were first developed, they were not always cost-competitive. However over the last decade, solid-state meters have ramped in volume resulting in a significant reduction in cost. The pricing of a solid-state meter is now the same or less than the electromechanical variants while providing many more features.

Solid-state energy meters have, along with the cost benefits and improved accuracy relative to electromechanical versions, several valuable additional features. Since the data is almost always stored digitally in a solid-state meter, the energy meter's data can be broadcast or accessed remotely with a modem using wireless, power-line carrier, or phone-line communication. This provides a large benefit to utilities both for "reading" meters and for diagnostic purposes. Another feature available with solid-state energy meters is the ability to charge different usage rates based on time of day (multi-tariff). This allows utilities to set energy costs higher during peak demand, thereby encouraging users to conserve energy during these times. This saves money for both the utility and the user.

A common requirement for solid-stage energy meters is that they keep (real) time in order to provide multi-tariff (time-of-day) billing. As a result, when this requirement is in place, the meter must have a means of operating when power is lost from the main supply; thus a battery backup is required. The battery backup is also required if the meter must be read when the (main) power is down, either using an LCD display (common to solid-state meters) or using a modem.

The cost of a battery is related to its energy storage capacity; the larger the energy stored, the higher the cost. To minimize the added cost to the meter, the power used by the meter when running from the battery must be minimized to enable a smaller, less expensive battery to be used.

SUMMARY OF THE INVENTION

It is therefore an object of this invention to provide an improved system controller for conserving power.

It is a further object of this invention to provide such an improved system controller which conserves power during low/no primary power conditions when auxiliary power is used.

It is a further object of this invention to provide such an improved system controller for use with an integrated energy meter.

It is a further object of this invention to provide such an improved system controller which automatically responds to a low/no primary power condition to prioritize power distribution to functional components.

It is a further object of this invention to provide such an improved system controller which selectively continues to supply power, periodically supplies power, and supplies no power to different functional components.

It is a further object of this invention to provide such an improved system controller which dynamically supplies power to different functional components in response to certain inputs.

It is a further object of this invention to provide such an improved system controller which automatically switches between primary power supply and auxiliary power supply.

It is a further object of this invention to provide such an improved system controller which draws negligible power from the non-selected power supply even if the non-selected power supply is at a higher voltage than the selected power supply.

The invention results from the realization that an improved, integrated energy metering system for conserving power in the low/no primary power conditions can be achieved using a system controller responsive to a voltage monitor for operating a switch circuit to apply an auxiliary power supply when the primary power supply decreases below a predetermined level and gate the power by cutting off power to a first class of circuit blocks and applying power continuously to a second class of circuit blocks.

The subject invention, however, in other embodiments, need not achieve all these objectives and the claims hereof should not be limited to structures or methods capable of achieving these objectives.

This invention features an integrated energy metering system including an energy meter that includes a voltage ADC for sensing voltage, a current ADC for sensing current, a microcontroller; a first memory device for storing program data for the energy meter; and a plurality of circuit blocks; a voltage monitor for monitoring the primary power supply; a power supply switch circuit for selectively applying one of the primary and auxiliary power supplies to the energy meter. There is also a system controller responsive to the voltage monitor for operating the switch circuit to apply the auxiliary power supply when the primary power supply voltage decreases below a predetermined level, to cut off power to a first class of circuit blocks in the energy meter and apply power continuously to a second class of circuit blocks, In a preferred embodiment the energy meter, power supply switch circuit, and system controller may be all on a single integrated circuit chip. The energy meter, power supply switch circuit, and system controller and voltage monitor may be all on a single integrated circuit chip. The power supply switch may block current flow to and from the unselected input whether the selected power supply is greater than, less than, or equal to the unselected supply. The microcontroller may be responsive to the ADCs for determining the power from the sensed voltage and current. The energy meter may include digital processing circuit for determining functions of the sensed voltage and current for delivery to the microcontroller. The energy meter may include a third class of circuit blocks which may be periodically enabled by the system controller. The system controller may include an interval timer for periodically enabling the third class of circuit blocks. The interval timer may operate each of the third class of circuit blocks at different periods. The second class of circuit blocks may include at least one of an LCD driver, a crystal oscillator and a real time clock. The third class of circuit blocks may include at least one of a temperature monitor circuit, primary supply voltage monitor, auxiliary supply voltage monitor and voltage reference. The first class of circuit blocks may include the ADCs, microcontroller and first memory device. The first class of circuit blocks may include the ADC's, microcontroller, first memory device, and the LCD drivers. The system controller may include a second memory device for identifying the periods(s) to be applied to the third class of circuit blocks. The second memory may identify the circuit blocks in each class. The system controller may be responsive to a wakeup input to enable the microcontroller and first memory device in auxiliary power mode. The system controller may include a system controller circuit configured in a primary power mode to enable the energy meter which triggers executing the program and in an auxiliary power mode to disable the microcontroller, first memory, and ADCs and disconnect their supplies. The system controller may include a system controller circuit configured in a primary power mode to enable the energy meter to trigger execution of the program, and in an auxiliary power mode to enable the microcontroller to selectively disable itself, the first memory, ADCs and disconnect their supplies. The system controller circuit may be further configured, in response to at least one wakeup input, to enable the microcontroller and first memory device, execute the program and run the routine for the particular input, clear the input, and return to one of the primary and auxiliary power modes. The wakeup input may be triggered by an external interrupt. The wakeup input may be triggered by a communication interrupt. The wakeup input may be triggered by change in a monitored value. The wakeup input may be triggered by change in temperature. The routine for the temperature input wakeup may include adjustment of RTC compensation. The routine for the input wakeup may include enabling the LCD driver. The wakeup input may be triggered by change in a measurement made by an ADC. The wakeup input may be triggered by completion of a measurement made by an ADC. The wakeup input may be triggered by a timing device. The energy meter may include a low drop out regulator responsive to the selected power supply to in turn provide power to the microcontroller and first memory device when enabled and disconnect power to the microcontroller and first memory device when disabled. The energy meter may include a low drop out regulator responsive to the selected power supply to in turn provide power to the microcontroller and first memory device when enabled and disconnect power to the microcontroller and first memory device when disabled. The energy meter may include a switch interconnecting the microcontroller and first memory device and the selected power supply for connecting power to the microcontroller and first memory device when enabled and disconnecting power when disabled. The switch circuit may include first and second PMOS transistors with their sources connected together and their drains connected one to an input terminal and one to an output terminal, a third PMOS transistor with its source connected to the sources of the first and second transistors, and its gate connected to a control terminal; a fourth NMOS transistor with its drain connected to the drain of the third transistor and to gates of the first and second transistors, its source connected to a reference level and its gate to the control terminal so that there is a bidirectional conduction path through the first and second transistors between the input and output terminals when the control terminal is high and, regardless of whether the input terminal or the output terminal is at a higher voltage, one of the first and second transistors will block the current flow between the input and output terminals.

BRIEF DESCRIPTION OF THE SEVERAL VIEWS OF THE DRAWINGS

Other objects, features and advantages will occur to those skilled in the art from the following description of a preferred embodiment and the accompanying drawings, in which:

FIGS. 6, 7, and 8 are schematic diagrams of alternative implementations for controlling power to the microcontroller and first memory device in FIG. 2.

DETAILED DESCRIPTION OF THE INVENTION

Figure 1:
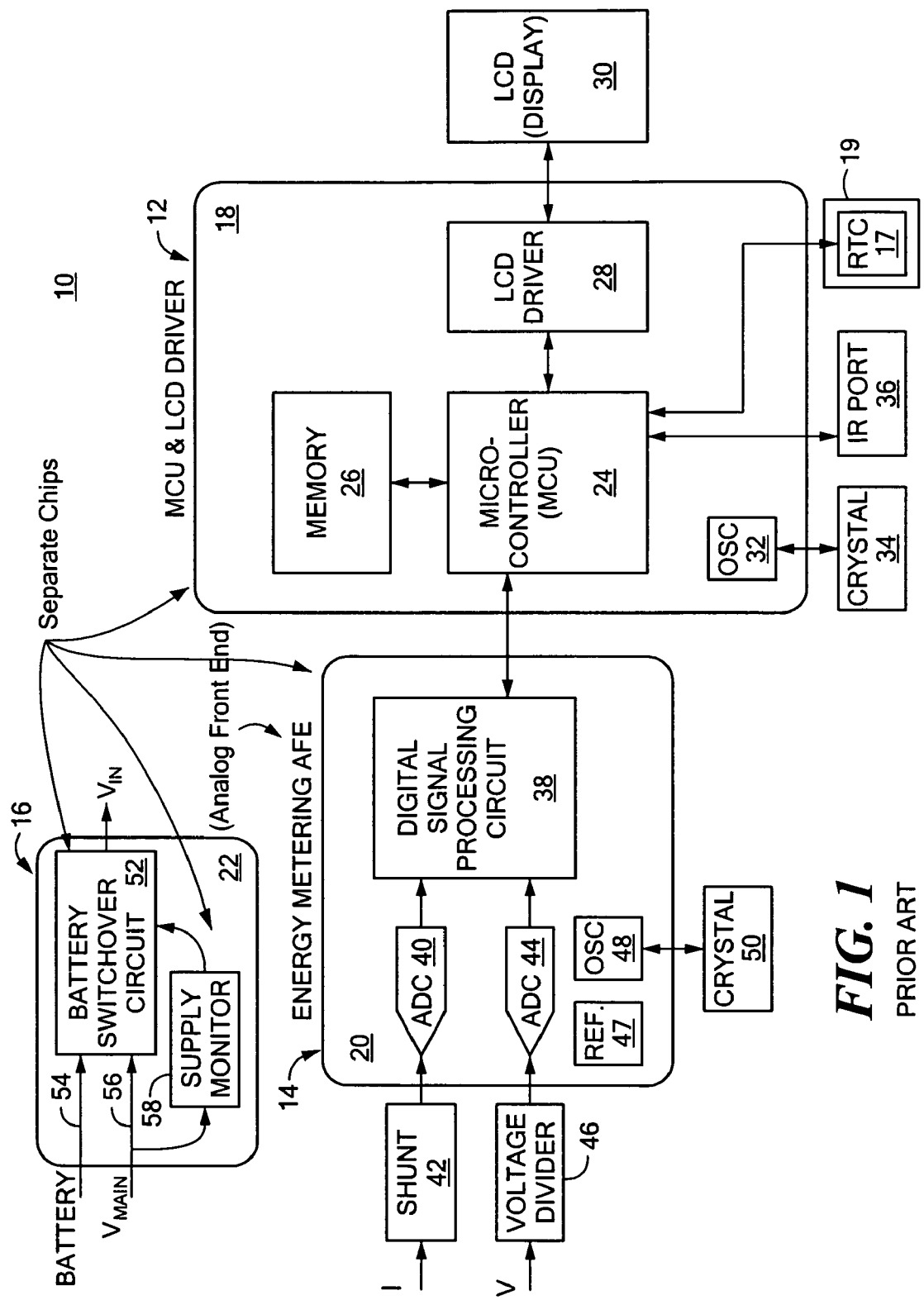
FIG. 1 is a schematic block diagram of a prior art energy metering system.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a typical prior art energy metering system 10 including a microcontroller, an LCD driver unit 12, energy metering analog front end 14, power control 16, and a real time clock (RTC) 17. Each of which is on its own separate chip 18, 20, 22, 19, respectively. Microcontroller and LCD driver unit 12 includes microcontroller 24, associated memory 26, and LCD driver 28, which drives an off-chip LCD display 30. There is also an oscillator 32 which typically uses an off-chip crystal 34 and microcontroller 24 may have an IR port 36. Energy metering analog front end unit 14 includes a digital signal processing circuit 38, a current ADC 40 which senses current through shunt 42, a voltage ADC 44 which senses voltage through voltage divider 46, and a voltage reference 47. Unit 14 also may include an oscillator 48 which may use an off-chip crystal 50. Power controller unit 16 includes a battery switch over circuit 52 which receives both battery input 54 and the main voltage supply $V_{main}$ 56. The main voltage supply is monitored by supply monitor circuit 58. When the main supply $V_{main}$ 56 fails or goes below a predetermined level, supply monitor 58 indicates this to battery switch through circuit 52 which then switches from $V_{main}$ 56 to battery 54 as its source of supply to provide Vin, the power supply voltage to units 12, 14, 17 and LCD display 30.

In operation, the current and voltage are acquired by ADCs 40 and 44, respectively, and delivered to digital signal processing circuit 38, which performs the signal processing and calculates some parameters such as power, RMS voltage, and other quantities, before delivering the data to microcontroller 24. Microcontroller 24 may then calculate any remaining desired parameters for ultimate delivery to LCD driver 28 for display in LCD display 30.

Figure 2:
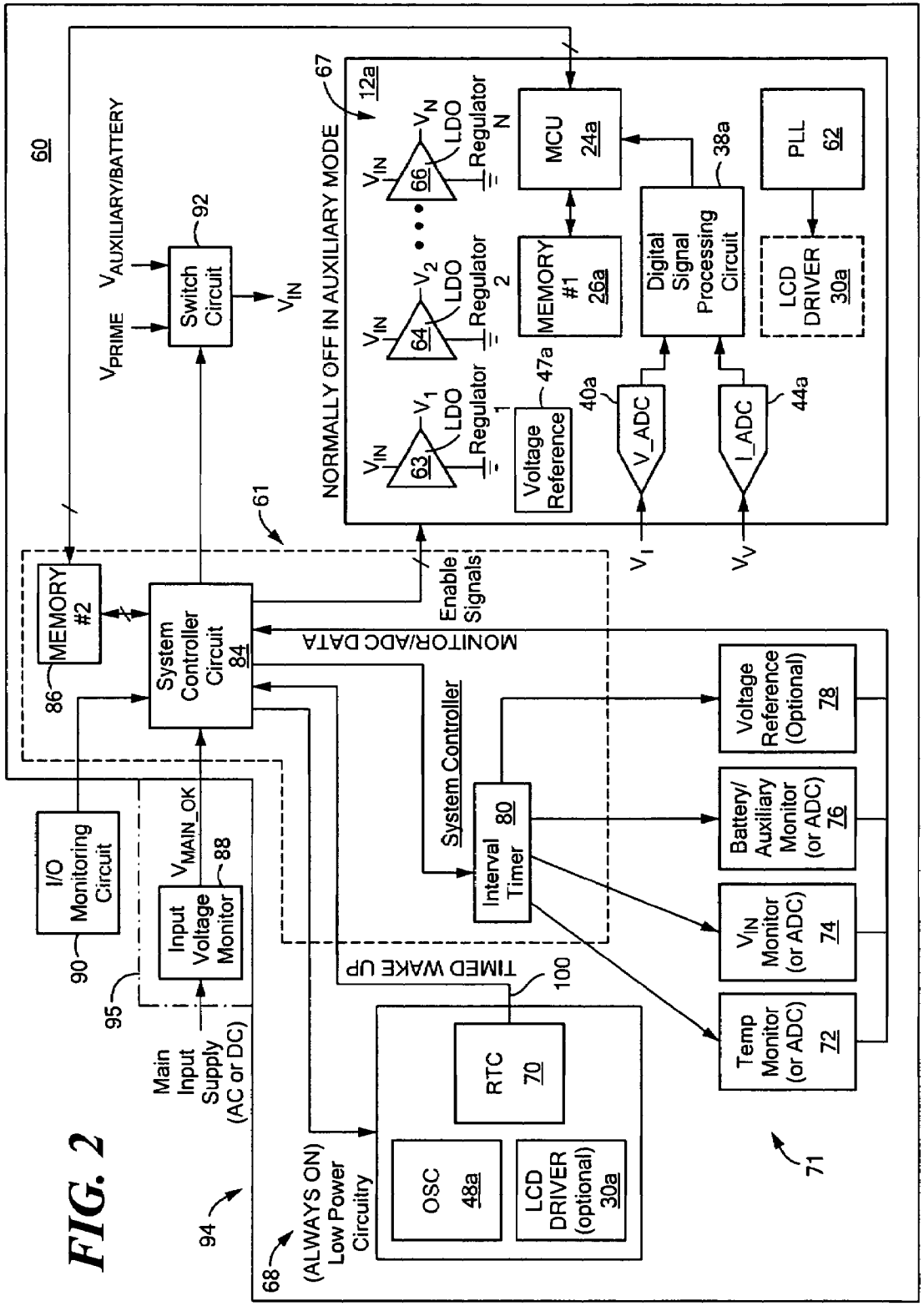
FIG. 2 is a schematic block diagram of an energy metering system with a system controller according to this invention.

An improved integrated energy metering system 60 with a system controller 61, FIG. 2, according to this invention, includes signal processing unit 12a which in addition to voltage ADC 40a, current ADC 44a, memory 26a, digital signal processing 38a and microcontroller 24a, may also include phase locked loop 62, for modifying the clock rate, and LCD Driver 30a, and one or more low drop out (LDO) regulators 63, 64, 66 which respond to the power supply voltage $V_{in}$ to provide modified version thereof to some or all of the various components in unit 12a. The circuit blocks in signal processing unit 12a are generally placed in a first class 67 as those which will normally be turned off in the auxiliary power mode. Integrated energy metering system 60 also includes a second class of circuit blocks 68, such as oscillator 48a, real time clock 70 and optionally LCD driver 30a which may be always on as they draw very low power. The second class 68 of circuit blocks could also include ADCs 40a, 44a, microcontroller unit 24a, first memory 26a, and LCD driver 30a and voltage reference circuit 47a if desired. A third class 71 of circuit blocks which may be on periodically may include a temperature monitor 72, $V_{in}$ monitor 74, auxiliary power monitor 76, and a voltage reference circuit 78. Voltage monitor 88 may also be in third class 71. The temperature monitor 72, $V_{IN}$ monitor 74, and auxiliary power monitor 76, may be implemented as ADCs. The time interval for enabling each of the various circuits 72-78 is controlled by interval timer 80 which forms a part of system controller 61 which also includes system controller circuit 84 and a second memory 86. Energy metering system 60 also includes an input voltage monitor 88 which senses when the main input supply is below a predetermined threshold and delivers a signal representative thereof to system controller circuit 84. I/O monitoring circuit 90 detects external interrupts or communication activity and then provides an output to system controller circuit 84 which may trigger enable signals to signal processing unit 12a when operating in auxiliary power mode, dependent upon instructions stored in second memory 86.

The first memory 26a in signal processing unit 12a contains program information. The second memory 86 located in system controller circuit 84 contains, for example, the times to be applied by interval timer 80 to the various periodic circuits 72-78.

In operation, when the primary supply voltage $V_{Primary}$ is sufficient, the system operates in a normal mode, however when $V_{Primary}$ goes below a particular threshold, system controller circuit 84 is informed of this by input voltage monitor 88 where upon it drives switch circuit 92 to disconnect from $V_{Primary}$ and connect the auxiliary supply $V_{Auxiliary}$ to the supply $V_{in}$. In this condition, the first class of circuits 67 in signal processing unit 12a would be off, the second class of circuits 68 which require only low power, circuits 48a, 70, and 30a, would be on continuously, and the third class 71 of periodically operated circuits 72-78 would be operated at intervals as directed by interval timer 80. Periodically a wake up signal from real time clock 70 may be provided on line 100 to system controller circuit 84 to cause it to momentarily power up one or more components in signal processing unit 12a. System controller circuit 84 also receives input from, for example, temperature monitor 72, $V_{in}$ monitor 74 and battery monitor 76 so that if any one of those has substantially varied, system controller circuit 84 can take appropriate action. For example, when temperature monitor 72 detects a change in temperature, the system controller circuit 84 will selectively wakeup circuits microcontroller circuit 24a, phase locked loop 62, LDO 63, and first memory 26a in the signal processing unit 12a which are then used to change the calibration parameters used by RTC 70.

System controller circuit 84 is also responsive to I/O monitoring circuit 90. For example, a meter reader may provide an external interrupt requesting a visual meter reading in which case microcontroller 24a, memory 26a, and LCD driver 30a would be energized momentarily to enable the reading. LCD driver 30a while shown in the group of low power circuits 68 may also be grouped with the first class of normally off components 67 as shown in phantom. All of the components shown in FIG. 2 may be included on a single chip. Alternatively, all of the components except input voltage monitor 88 may be included on a single chip.

Figure 3:
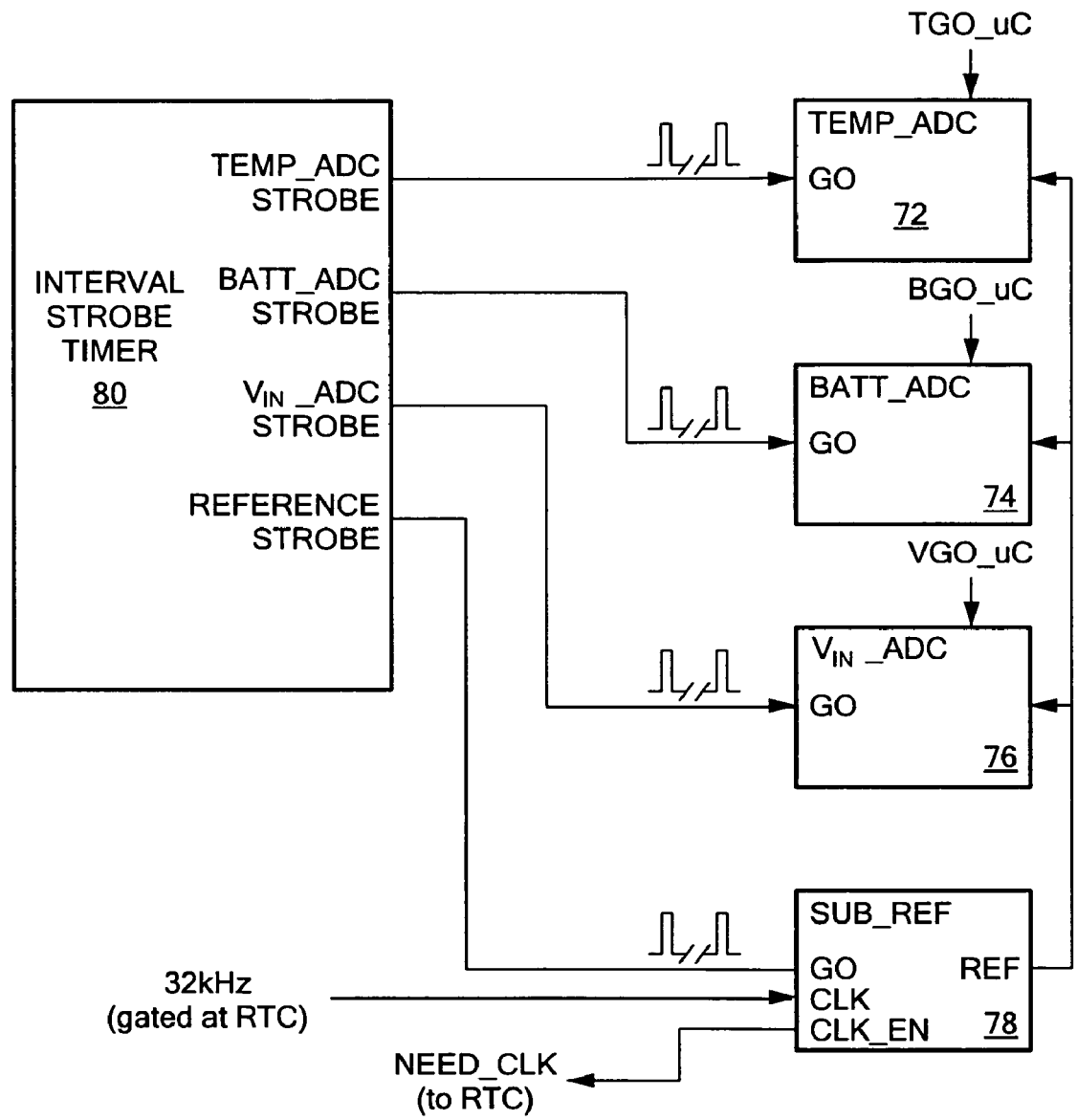
FIG. 3 is a schematic block diagram of the interval timer of FIG. 2.

Interval timer 80 may simply include an interval strobe timer 96, FIG. 3, which provides the periodic enabling signal to each of circuits 72-78. The periodic signals from interval strobe timer 96 may be the same for each of those circuits or may be different for each one and may vary from time to time as programmed by system controller circuit 84 as represented in memory 86, FIG. 2.

Figure 4:
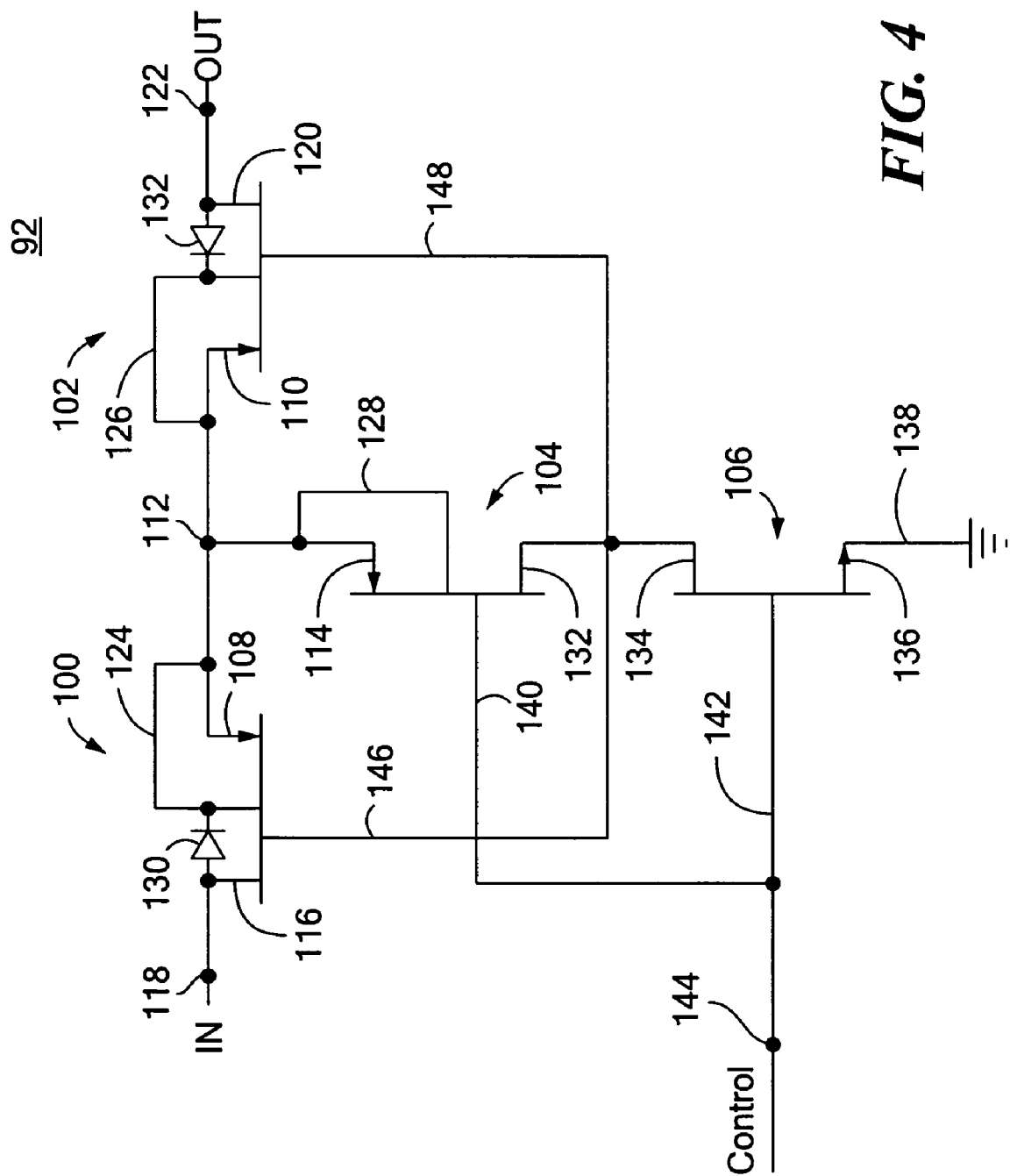
FIG. 4 is a more detailed diagram of the switch circuit of FIG. 2.

In order to prevent conduction between the output of the switch circuit 92 and whichever input supply is not selected, regardless of the relative voltage between the two supply inputs, one or both of the supply switches may be implemented as shown in FIG. 4. Here three PMOS transistors 100, 102, and 104 and one NMOS transistors 106 are used. Transistors 100 and 102 have their sources 108, 110 connected together at 112 and further connected with source 114 of transistor 104. The drain 116 of transistor 100 is connected to the input 118 and the drain 120 of transistor 102 is connected to the output 122. The wells of transistors 100, 102 and 104 are represented at 124, 126, and 128, respectively. The parasitic diodes formed between wells 124 and 126 and their respective drains, 116 and 120, are shown as 130, 132, respectively. The drain 132 of transistor 104 is connected to the drain 134 of transistor 106, as are gates 146 and 148 of transistors 100 and 102 The source 136 of transistor 106 is connected to a reference level 138 such as, for example, ground. The gates 140 and 142 of transistor 104 and 106, respectively, are connected together and to the control input 144. With control high, transistor 106 conducts, transistor 104 is off and both transistors 100 and 102 conduct. The well, drain, and source potentials of transistors 100 and 102 are all equal and since transistors 100 and 102 are on.

Conversely, in the condition when control 144 is low, transistor 106 is off and transistor 104 conducts and shorts the gates, wells, and sources of transistors 100 and 102 together. Then if output 122 is higher than input 118, diode 132 conducts since it is forward biased but diode 130 is reverse biased and blocks current flow. Since the gate and source of transistor 100 are pinned to zero, transistor 100 is off and therefore also blocks current flow. Conversely if input 118 is higher than output 122 the reverse condition occurs. This bidirectional blocking of the current flow is necessary since the auxiliary power supply may be at a higher or lower voltage potential than the primary power supply while the primary power supply is connected to $V_{IN}$.

Figure 5:
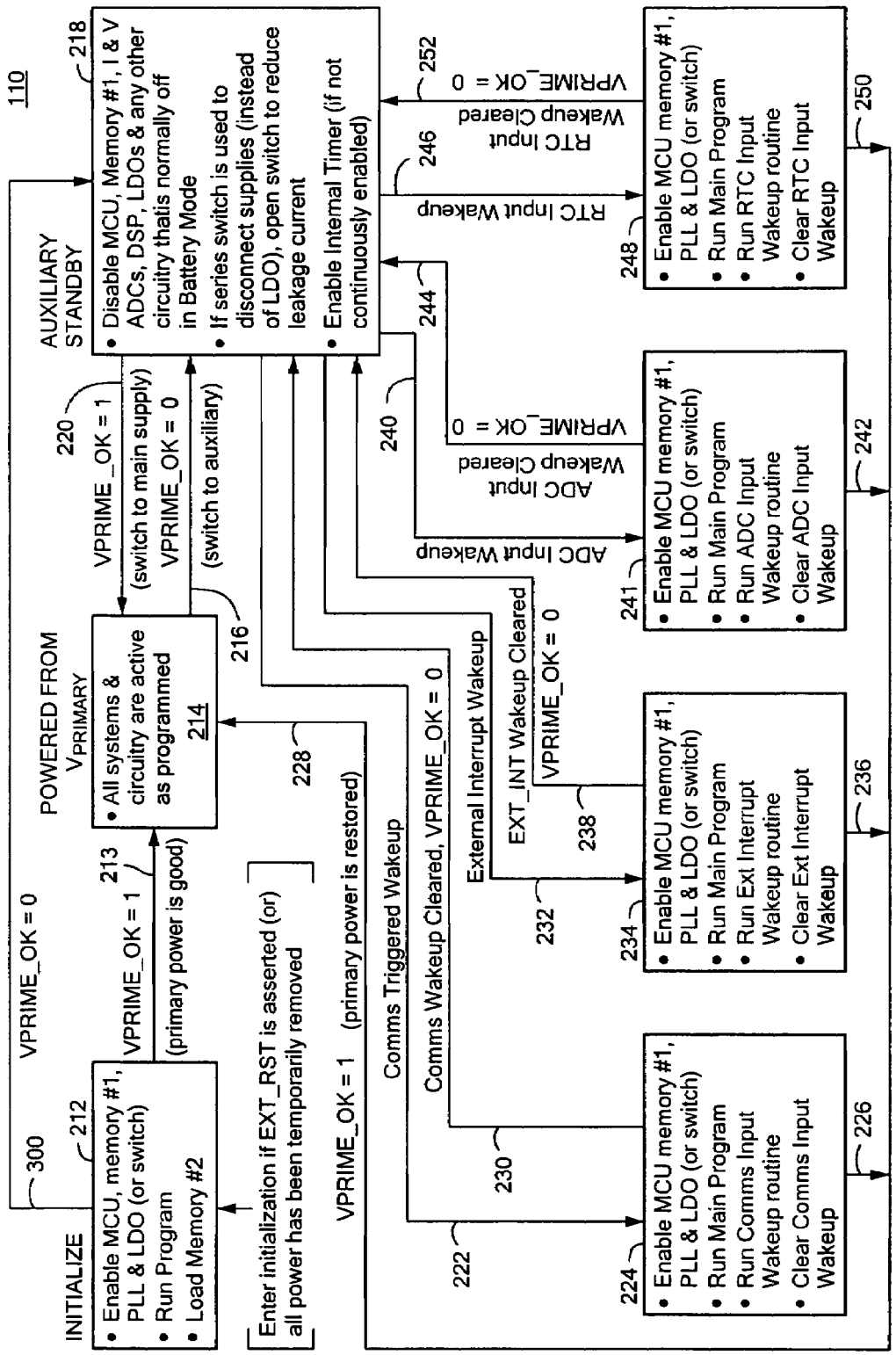
FIG. 5 is a state diagram showing the configuration of the system controller of FIG. 2.

System controller circuit 84, FIG. 2, may be implemented with software or as a hard wired logic circuit represented by state diagram 210, FIG. 5 which should be read with simultaneous reference to FIG. 2. Initializing begins 212 with enabling microcontroller unit 24a and memory 26a, as well as phase locked loop 62 and any of LDO regulators 63, 64, 66, as necessary. The program is then executed from first memory 26a and second memory 86 in system controller 61 is loaded. If the main voltage $V_{Primary}$ is ok, that is, the VPrime_OK signal on line 213 is asserted, then the system is powered from $V_{Primary}$ 214. If the VPrime_OK signal is not asserted on line 300, then auxiliary standby mode is entered 218. This time microcontroller 24a and memory 26a will be disabled along with ADCs 40a and 44a, digital signal processing circuit 38a, LDO 63, 64, 66 and any other circuitry that may be normally off in the auxiliary power mode. If the series switch, either in the supply line or the ground line, is used to disconnect the supplies instead of LDOs 63, 64, 66, then the switches are open to reduce the leakage current. At this point the interval timer 80 is enabled. However, if interval timer 80 is always periodically operating circuits 72-78, i.e. it is already enabled, then of course it need not be enabled now. The duty cycle of the various circuits, however, may be reduced or increased. If $V_{Primary}$ is restored, that is VPrime_OK is asserted 220, then the system moves from auxiliary standby 218 back to powered from $V_{Primary}$ 214. Initialization 212 is also entered if an external reset is asserted or subsequently after all power has been temporarily removed. At any time during the auxiliary standby operation 218, an input wakeup may occur. For example, a communications triggered wakeup 222 may cause state 224, where the microcontroller 24a and memory 26a are enabled, as well as phase locked loop 62 and any necessary LDOs 63, 64, 66. Microcontroller 24a executes the main program and a specific communication input routine. At the completion of this, the communication triggered wakeup 230 is cleared and the system returns to auxiliary standby 218 via 230. Alternatively if primary power is restored, VPrime_OK is asserted, the system returns to powered from $V_{Primary}$ 214 via 226 and 228.

An external interrupt wakeup may occur 232 causing state 234 where the microcontroller 24a and memory 26a are enabled, along with phase lock loop 62 and LDOs 63, 64, 66, as necessary. Microcontroller 24a executes the main program and a specific external interrupt wakeup routine. At the completion of this, the external interrupt wakeup 232 is cleared and the system returns to auxiliary standby 218 via 238. Alternatively if primary power is restored, VPrime_OK is asserted, the system returns to powered from $V_{Primary}$ 214 via 236 and 228. Alternatively, the system controller circuit 84 may be configured in a primary power to enable the energy meter to trigger execution of the program, and in an auxiliary power mode to enable the microcontroller to selectively disable itself, the first memory, ADCs and disconnect their supplies, once the input wakeup routines have been run.

An ADC input wakeup on line 240 moves the system to state 241 and executes the same program with the exception that the routine run is the ADC input wakeup routine. After the wakeup routine is executed, the ADC input wakeup 240 is cleared and the system returns to auxiliary standby 218 via 244. Alternatively if primary power is restored, VPrime_OK is asserted, the system returns to powered from $V_{Primary}$ 214 via 242 and 228.

And finally when the real time clock (RTC) input wakeup occurs, the system moves to state 248 and executes the same program with the exception that the routine run is the RTC input wakeup routine. After the wakeup routine is executed, the RTC input wakeup 246 is cleared and the system returns to auxiliary standby 218 via 252. Alternatively if primary power is restored, VPrime_OK is asserted, the system returns to powered from $V_{Primary}$ 214 via 250 and 228.

The disconnecting of the supplies from the various circuits, microcontroller 24a, memory 26a, phase lock loop 62, etc., are done so as to minimize leakage current in the off condition. This can be done using a low drop out LDO regulator 260, FIG. 6, which when enabled provides power to microcontroller 24a and memory 26a but when disabled completely cuts off microcontroller 24a and memory 26a from the power source $V_{in}$. Alternatively, the same thing can be accomplished by using a switch 260a, FIG. 7, in line with the power supply or a switch 260b in line with ground, FIG. 8.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. An integrated energy metering system comprising:
    an energy meter including a first class of circuit blocks and a second class of circuit blocks comprising circuitry that requires less power than the first class of circuit blocks, the first class of circuit blocks includes a voltage ADC for sensing voltage, a current ADC for sensing current, a microcontroller, and a first memory device for storing program data for the energy meter;
    a voltage monitor for monitoring a primary power supply;
    a power supply switch circuit for selectively applying one of said primary and auxiliary power supplies to said energy meter; and
    a system controller responsive to said voltage monitor operating said switch circuit to apply the auxiliary power supply when said primary power supply voltage decreases below a predetermined level and gating the power by cutting off power to the first class of circuit blocks, and applying power continuously to the second class of circuit blocks in the energy meter.

2. The integrated energy metering system of claim 1 in which said energy meter, power supply switch circuit, and system controller are all on a single integrated circuit chip.

3. The integrated energy metering system of claim 1 in which said energy meter, power supply switch circuit, system controller and voltage monitor are all on a single integrated circuit chip.

4. The integrated energy metering system of claim 1 in which said power supply switch blocks current flow to and from the unselected input whether the selected power supply is greater than, less than, or equal to the unselected supply.

5. The integrated energy metering system of claim 1 in which said microcontroller is responsive to said ADCs for determining the power from the sensed voltage and current.

6. The integrated energy metering system of claim 1 in which said energy meter includes digital processing circuit for determining functions of the sensed voltage and current for delivery to said microcontroller.

7. The integrated energy metering system of claim 1 in which said energy meter includes a third class of circuit blocks which said system controller periodically enables.

8. The integrated energy metering system of claim 7 in which said system controller includes an interval timer for periodically enabling said third class of circuit blocks.

9. The integrated energy metering system of claim 8 in which said interval timer operates each of said third class of circuit blocks at independent periods.

10. The integrated energy metering system of claim 1 in which said second class of circuit blocks includes at least one of an LCD driver, a crystal oscillator and a real time clock.

11. The integrated energy metering system of claim 8 in which said third class of circuit blocks includes at east one of a temperature monitor circuit, primary supply voltage monitor, auxiliary supply voltage monitor, external voltage monitor, and voltage reference.

12. The integrated energy metering system of claim 1 in which said first class of circuit blocks includes one or more LCD drivers.

13. The integrated energy metering system of claim 1 in which said system controller includes a second memory device for identifying the periods(s) to be applied to a third class of circuit blocks.

14. The integrated energy metering system of claim 13 in which said second memory device identifies the circuit blocks in each class.

15. The integrated energy metering system of claim 1 in which said system controller is responsive to a wakeup input to enable said microcontroller and first memory device in auxiliary power mode.

16. The integrated energy metering system of claim 1 in which said system controller includes a system controller circuit configured in a primary power mode to enable the energy meter which triggers executing the program and in an auxiliary power mode to disable the microcontroller, first memory, and ADC's and disconnect their supplies.

17. The integrated energy metering system of claim 1 in which said system controller includes a system controller circuit configured in a primary power mode to enable the energy meter to trigger execution of the program, and in an auxiliary power mode to enable the microcontroller to selectively disable itself, the first memory, ADC's and disconnect their supplies.

18. The integrated energy metering system of claim 1 in which said system controller circuit is further configured, in response to at least one wakeup input, to enable the microcontroller and first memory device, execute a program and run a routine for the particular input, clear the input, and return to one of a primary and an auxiliary power modes.

19. The integrated energy metering system of claim 18 in which said wakeup input is triggered by an external interrupt.

20. The integrated energy metering system of claim 18 in which said wakeup input is triggered by a communication interrupt.

21. The integrated energy metering system of claim 18 in which said wakeup input is triggered by change in a monitored value.

22. The integrated energy metering system of claim 18 in which said wakeup input is triggered by change in temperature.

23. The integrated energy metering system of claim 22 in which the routine for the temperature input wakeup includes adjustment of RTC compensation.

24. The integrated energy metering system of claim 18 in which the routine for the input wakeup includes enabling an LCD driver.

25. The integrated energy metering system of claim 18 in which said wakeup input is triggered by change in a measurement made by an ADC.

26. The integrated energy metering system of claim 18 in which said wakeup input is triggered by completion of a measurement made by an ADC.

27. The integrated energy metering system of claim 18 in which said wakeup input is triggered by a timing device.

28. The integrated energy metering system of claim 1 in which said energy meter includes a low drop out regulator responsive to the selected power supply to in turn provide power to said microcontroller and first memory device when enabled and disconnect power to said microcontroller and first memory device when disabled.

29. The integrated energy metering system of claim 1 in which said energy meter includes a switch interconnecting said microcontroller and first memory device and the selected power supply for connecting power to said microcontroller and first memory device when enabled and disconnecting power when disabled.

30. An integrated energy metering system comprising:
an energy meter including a voltage ADC for sensing voltage, a current ADC for sensing current, a microcontroller, a first memory device for storing program data for the energy meter; and a plurality of circuit blocks;
a voltage monitor for monitoring a primary power supply;
a power supply switch circuit for selectively applying one of said primary and auxiliary power supplies to said energy meter; and
a system controller responsive to said voltage monitor operating said switch circuit to apply the auxiliary power supply when said primary power supply voltage decreases below a predetermined level and gating the power by cutting off power to a first class of circuit blocks, and applying power continuously to a second class of circuit blocks in the energy meter, wherein said switch circuit includes first and second PMOS transistors with their sources connected together and their drains connected one to an input terminal and one to an output terminal, a third PMOS transistor with its source connected to the sources of the first and second transistors, and its gate connected to a control terminal; a fourth NMOS transistor with its drain connected to the drain of said third transistor and to gates of said first and second transistors; its source connected to a reference level and its gate to said control terminal so that there is a bidirectional conduction path through said first and second transistors between said input and output terminals when the control terminal is high, and regardless of whether the input terminal or the output terminal is at higher voltage, one of said first and second transistors will block the current flow between the input and output terminals.

* * * * *